(12) United States Patent
Tsai et al.

(10) Patent No.: US 12,131,984 B2
(45) Date of Patent: Oct. 29, 2024

(54) HETEROGENEOUS FAN-OUT STRUCTURE AND METHOD OF MANUFACTURE

(71) Applicant: Taiwan Semiconductor Manufacturing Co., Ltd., Hsinchu (TW)

(72) Inventors: Po-Hao Tsai, Zhongli (TW); Po-Yao Chuang, Hsinchu (TW); Shin-Puu Jeng, Hsinchu (TW); Techi Wong, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/302,112

(22) Filed: Apr. 18, 2023

(65) Prior Publication Data

US 2023/0253301 A1    Aug. 10, 2023

Related U.S. Application Data

(63) Continuation of application No. 17/320,858, filed on May 14, 2021, now Pat. No. 11,646,256, which is a
(Continued)

(51) Int. Cl.
*H01L 23/498* (2006.01)
*H01L 21/48* (2006.01)
(Continued)

(52) U.S. Cl.
CPC ...... *H01L 23/49822* (2013.01); *H01L 21/486* (2013.01); *H01L 21/56* (2013.01); *H01L 21/561* (2013.01); *H01L 21/568* (2013.01); *H01L 21/6835* (2013.01); *H01L 23/3114* (2013.01); *H01L 23/3128* (2013.01); *H01L 23/49816* (2013.01); *H01L 23/49894* (2013.01); *H01L 24/03* (2013.01); *H01L 24/05* (2013.01); *H01L 24/11* (2013.01); *H01L 24/13* (2013.01);
(Continued)

(58) Field of Classification Search
CPC ............ H01L 23/3114; H01L 23/3128; H01L 23/49816; H01L 24/05; H01L 2924/181; H01L 24/13; H01L 24/81; H01L 24/19; H01L 25/50; H01L 25/0657; H01L 2224/0231; H01L 2221/68359; H01L 21/6835; H01L 21/568; H01L 2224/02331; H01L 23/5389; H01L 2224/83005
See application file for complete search history.

(56) References Cited

U.S. PATENT DOCUMENTS 8,361,842 B2    1/2013  Yu et al.
8,680,647 B2    3/2014  Yu et al.
(Continued)

FOREIGN PATENT DOCUMENTS

CN    103681613 A    3/2014
CN    105280579 A    1/2016
(Continued)

*Primary Examiner* — Thanh Y. Tran
(74) *Attorney, Agent, or Firm* — Slater Matsil, LLP

(57) ABSTRACT

A semiconductor device and method of manufacture are provided whereby an interposer and a first semiconductor device are placed onto a carrier substrate and encapsulated. The interposer comprises a first portion and conductive pillars extending away from the first portion. A redistribution layer located on a first side of the encapsulant electrically connects the conductive pillars to the first semiconductor device.

20 Claims, 12 Drawing Sheets

Related U.S. Application Data continuation of application No. 16/593,347, filed on Oct. 4, 2019, now Pat. No. 11,018,081, which is a continuation of application No. 15/875,124, filed on Jan. 19, 2018, now Pat. No. 10,468,339.

(51) Int. Cl.

| | | |
|---|---|---|
| *H01L 21/56* | (2006.01) | |
| *H01L 21/683* | (2006.01) | |
| *H01L 23/00* | (2006.01) | |
| *H01L 23/31* | (2006.01) | |
| *H01L 25/00* | (2006.01) | |
| *H01L 25/065* | (2023.01) | |

(52) U.S. Cl.
CPC ............... *H01L 24/19* (2013.01); *H01L 24/81* (2013.01); *H01L 24/96* (2013.01); *H01L 25/0657* (2013.01); *H01L 25/50* (2013.01); *H01L 2221/68359* (2013.01); *H01L 2221/68372* (2013.01); *H01L 2224/0231* (2013.01); *H01L 2224/02331* (2013.01); *H01L 2224/02379* (2013.01); *H01L 2224/18* (2013.01); *H01L 2924/181* (2013.01); *H01L 2924/18161* (2013.01)

(56) References Cited

U.S. PATENT DOCUMENTS

| | | |
|---|---|---|
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 10,276,543 B1 | 4/2019 | Liao et al. |
| 10,971,476 B2 | 4/2021 | Gu et al. |
| 2011/0291288 A1 | 12/2011 | Wu et al. |
| 2012/0119388 A1 | 5/2012 | Cho et al. |
| 2012/0187568 A1 | 7/2012 | Lin et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0249101 A1 | 9/2013 | Lin et al. |
| 2013/0307140 A1 | 11/2013 | Huang et al. |
| 2013/0341784 A1 | 12/2013 | Lin et al. |
| 2014/0070422 A1 | 3/2014 | Hsiao et al. |
| 2014/0077389 A1 | 3/2014 | Shim et al. |
| 2014/0124949 A1 | 5/2014 | Paek et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0252647 A1 | 9/2014 | Huang et al. |
| 2014/0264930 A1 | 9/2014 | Yu et al. |
| 2015/0001708 A1 | 1/2015 | Lin |
| 2015/0262909 A1 | 9/2015 | Chen |
| 2015/0303158 A1 | 10/2015 | Huang et al. |
| 2016/0043047 A1 | 2/2016 | Shim et al. |
| 2016/0307778 A1 | 10/2016 | Lin et al. |
| 2017/0345764 A1 | 11/2017 | Chang et al. |
| 2020/0273840 A1 | 8/2020 | Elsherbini et al. |

FOREIGN PATENT DOCUMENTS

| | | |
|---|---|---|
| CN | 106206529 A | 12/2016 |
| CN | 107424940 A | 12/2017 |
| JP | 5617846 B2 | 11/2014 |
| TW | 201401466 A | 1/2014 |
| TW | 201618196 A | 5/2016 |

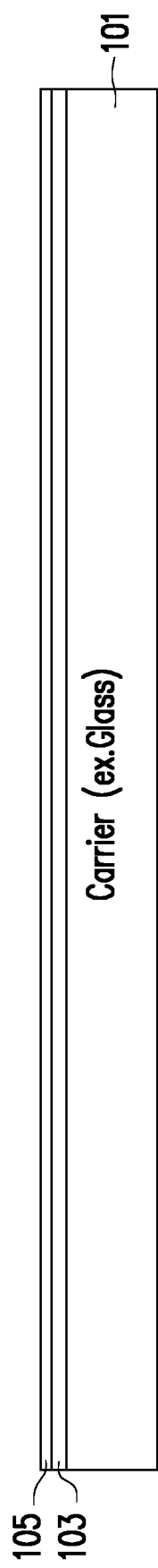
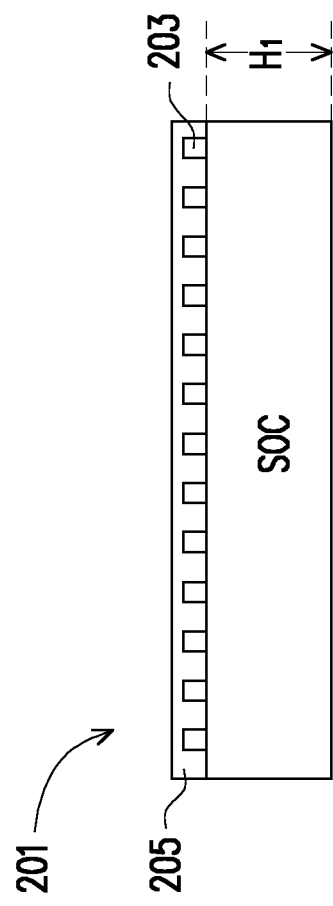
FIG. 1
FIG. 2

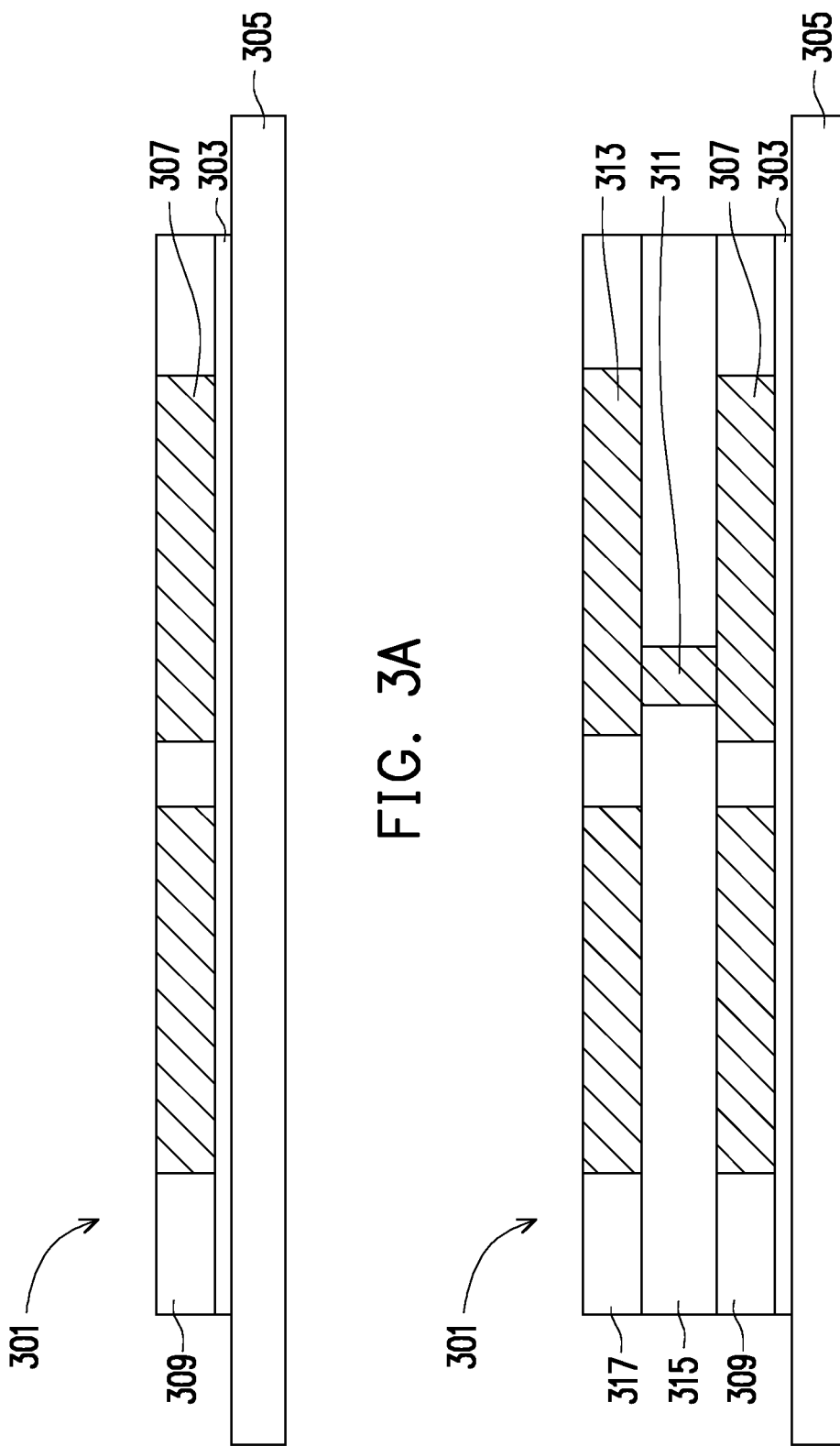

HETEROGENEOUS FAN-OUT STRUCTURE AND METHOD OF MANUFACTURE

PRIORITY CLAIM AND CROSS-REFERENCE

This application is a continuation of U.S. patent application Ser. No. 17/320,858, entitled "Heterogeneous Fan-Out Structure and Method of Manufacture," filed on May 14, 2021, now U.S. Pat. No. 11,646,256, issued May 9, 2023, which is a continuation of U.S. patent application Ser. No. 16/593,347, entitled "Heterogeneous Fan-Out Structure and Method of Manufacture," filed on Oct. 4, 2019, now U.S. Pat. No. 11,018,081, issued on May 25, 2021, which is a continuation of U.S. patent application Ser. No. 15/875,124, entitled "Heterogeneous Fan-Out Structure and Method of Manufacture," filed on Jan. 19, 2018, now U.S. Pat. No. 10,468,339, issued on Nov. 5, 2019, which applications are hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 illustrates a placement of an adhesive layer and a die attach film on a carrier in accordance with some embodiments.

FIG. 2 illustrates a first semiconductor device in accordance with some embodiments.

FIGS. 3A-3E illustrate a formation of a ring in accordance with some embodiments.

DETAILED DESCRIPTION

Figure 3C:
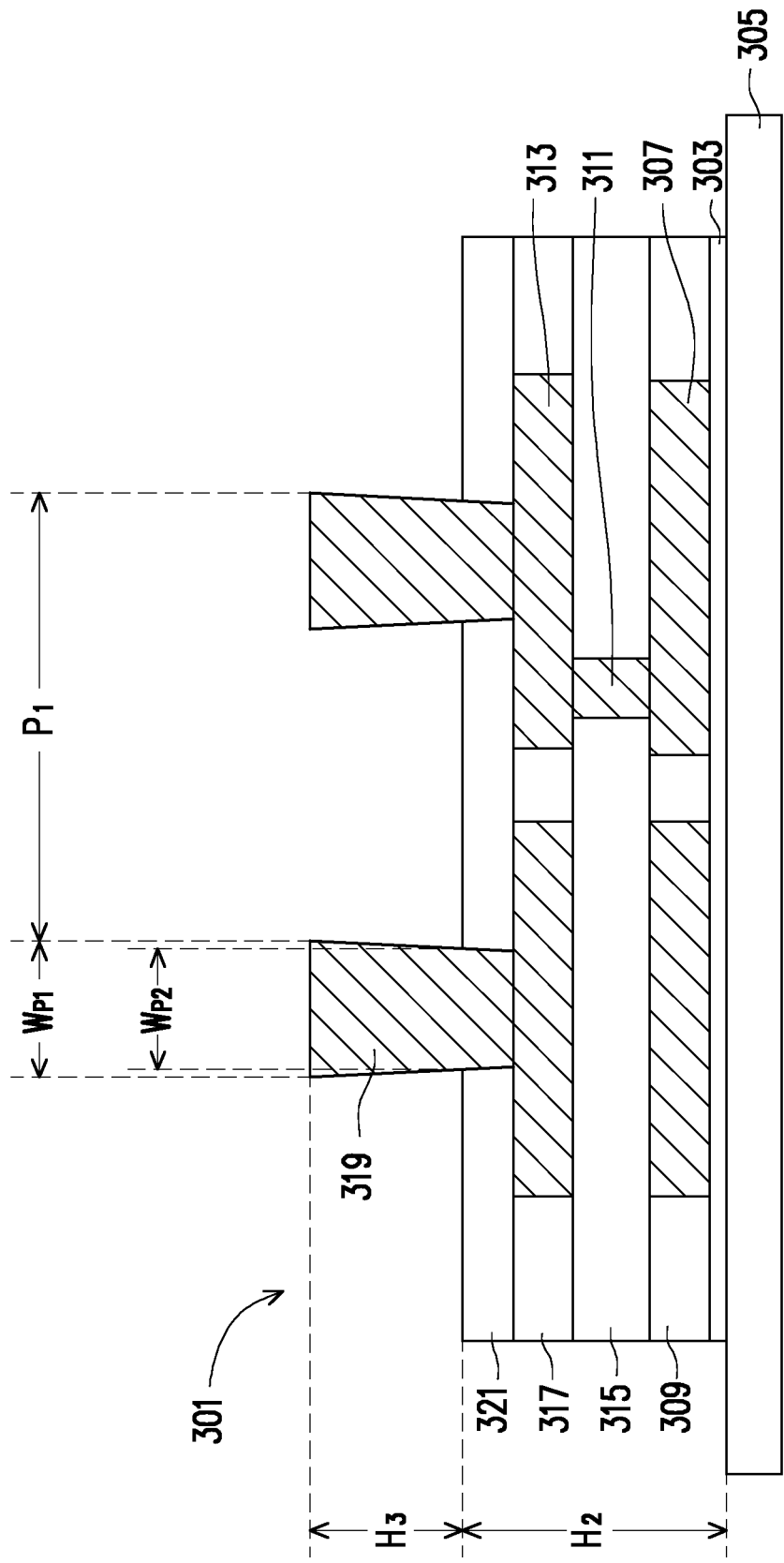

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to a heterogeneous fan-out structure with embedded through interposer vias along with a back-side redistribution layer. Embodiments are not, however, limited to the embodiments which are specifically described, and may be employed in an array of embodiments.

With reference now to FIG. 1, there is shown a first carrier substrate 101 with an adhesive layer 103 and a die attach film 105 over the first carrier substrate 101. The first carrier substrate 101 comprises, for example, silicon based materials, such as glass or silicon oxide, or other materials, such as aluminum oxide, combinations of any of these materials, or the like. The first carrier substrate 101 is planar in order to accommodate an attachment of semiconductor devices such as a first semiconductor device 201 and a ring 301 (also referred to as an interposer, not illustrated in FIG. 1 but illustrated and discussed below with respect to FIGS. 2-3D).

The adhesive layer 103 is placed on the first carrier substrate 101 in order to assist in the adherence of overlying structures (e.g., the first die attach film 105). In an embodiment the adhesive layer 103 may comprise a light to heat conversion (LTHC) material or an ultra-violet glue, although other types of adhesives, such as pressure sensitive adhesives, radiation curable adhesives, epoxies, combinations of these, or the like, may also be used. The adhesive layer 103 may be placed onto the first carrier substrate 101 in a semi-liquid or gel form, which is readily deformable under pressure.

The first die attach film 105 may be placed on the adhesive layer 103 in order to assist in the attachment of the first semiconductor device 201 and the ring 301 to the adhesive layer 103. In an embodiment the first die attach film 105 is an epoxy resin, a phenol resin, acrylic rubber, silica filler, or a combination thereof, and is applied using a lamination technique. However, any other suitable alternative material and method of formation may alternatively be utilized.

FIG. 2 illustrates a first semiconductor device 201 that will be attached to the first die attach film 105. In an embodiment the first semiconductor device 201 is a system-on-chip which includes a logic area and a memory area with, e.g., non-volatile memory (NVM) cells. The logic area may include circuitry, such as a transistor, for processing information received from the non-volatile memory cells and for controlling reading and writing functions of the NVM cells. In some embodiments, the NVM cells may be resistive random-access memory (RRAM) cells, phase-change random-access memory (PCRAM) cells, magnetoresistive random-access memory (MRAM) cells, or a transistor based random-access memory such as flash memory or static random-access memory (SRAM). An NVM cell may be used to hold a binary piece of data, or a bit. Depending on the type of memory cell, each NVM cell may include a pair of metal-insulator-metal (MiM) structures. Each MiM structure may include a bottom electrode and top electrode, with a dielectric layer sandwiched in between the two electrodes.

The first semiconductor device 201 also includes shallow-trench isolation (STI) features, and pluralities of metallization layers and vias. In an embodiment, the first semiconductor device 201 is fabricated using five metallization layers, with five layers of metallization vias or interconnects. Other embodiments may contain more or fewer metallization layers and a corresponding more or fewer number of vias. Logic area includes a full metallization stack, including a portion of each of metallization layers connected by interconnects, with some vias connecting the stack to a source/drain contact of logic transistor. NVM cells include a full metallization stack connecting MiM structures to memory cell transistors. Also included in the first semiconductor device 201 is a plurality of inter-metal dielectric (IMD) layers. Additional IMD layers may span the logic area and the memory cell area. The IMD layers may provide electrical insulation as well as structural support for the various features of first semiconductor device 201 during many fabrication process steps, some of which will be discussed herein.

In an embodiment the first semiconductor device 201 may be formed using deposition process, etching processes, planarization processes, combinations of these, or the like, and may be formed to have a first height $H_1$ that is suitable for the intended use of the first semiconductor device 201. For example, in an embodiment in which the first semiconductor device 201 is to be utilized in mobile applications, such as for use in a cellular handset, the first height $H_1$ may be between about 50 μm and about 600 μm, such as about 150 μm. However, any suitable dimension may be utilized.

FIG. 2 also illustrates that first external connectors 203 may be formed to provide conductive regions for contact between the metallization layers and, e.g., a redistribution layer (RDL) 701 (not illustrated in FIG. 2 but illustrated and described below with respect to FIG. 7). In an embodiment the first external connectors 203 may be conductive pillars and may be formed by initially forming a photoresist (not shown) to a thickness between about 5 μm to about 20 μm, such as about 10 μm. The photoresist may be patterned where the conductive pillars will extend. Once patterned, the photoresist may then be used as a mask, and the first external connectors 203 may be formed within the openings of the photoresist. The first external connectors 203 may be formed from a conductive material such as copper, although other conductive materials such as nickel, gold, solder, metal alloy, combinations of these, or the like may also be used. Additionally, the first external connectors 203 may be formed using a process such as electroplating, by which an electric current is run through the conductive portions of the metallization layers to which the first external connectors 203 are desired to be formed or a separate seed layer (not separately illustrated in FIG. 2), and the metallization layers or seed layer are immersed in a solution. The solution and the electric current deposit, e.g., copper, within the openings in order to fill and/or overfill the openings of the photoresist, thereby forming the first external connectors 203. Excess conductive material and photoresist outside of the openings may then be removed using, for example, an ashing process, a chemical mechanical polish (CMP) process, combinations of these, or the like.

However, as one of ordinary skill in the art will recognize, the above described process to form the first external connectors 203 is merely one such description, and is not meant to limit the embodiments to this exact process. Rather, the described process is intended to be merely illustrative, as any suitable process for forming the first external connectors 203 may alternatively be utilized. All suitable processes are fully intended to be included within the scope of the present embodiments.

Optionally, once the first external connectors 203 have been formed, a first protective layer 205 may be formed over the first external connectors 203 in order to provide support and protection. In an embodiment the first protective layer 205 may be a protective material such as polybenzoxazole (PBO) or polyimide (PI), silicon oxide, silicon nitride, silicon oxynitride, benzocyclobutene (BCB), or any other suitable protective material. The first protective layer 205 may be formed using a method such as a spin-on process, a deposition process (e.g., chemical vapor deposition), or other suitable process based upon the chosen material, and may be formed to a thickness of between about 1 μm and about 100 μm, such as about 20 μm.

Additionally, while the first semiconductor device 201 is illustrated as a single system on chip, this is intended to be illustrative only, and is not intended to be limiting to the embodiments. For example, the first semiconductor device 201 may also comprise any suitable semiconductor device, such as a single semiconductor die or a combination of multiple semiconductor dies. Any suitable device may be utilized for the first semiconductor device 201 and all such embodiments are fully intended to be included within the scope of the embodiments.

FIGS. 3A-3C illustrate a formation of a ring 301 which will also be attached to the first die attach film 105. In an embodiment the process may be initiated by forming a polymer layer 303 onto a second carrier substrate 305. The polymer layer 303 is placed over an optional adhesive layer (not separately illustrated) and is utilized in order to provide protection for overlying layers. In an embodiment the polymer layer 303 may be polybenzoxazole (PBO), although any suitable material, such as polyimide or a polyimide derivative, a prepreg (PP) material such as glass fiber, resin, and fillers, an Ajinomoto build-up film (ABF), combinations of these, or the like, may also be utilized. The polymer layer 303 may be placed using, e.g., a spin-coating process to a thickness of between about 0.5 µm and about 10 µm, such as about 5 µm, although any suitable method and thickness may alternatively be used.

A seed layer (not separately illustrated) is formed over the polymer layer 303. In an embodiment the seed layer is a thin layer of a conductive material that aids in the formation of a thicker layer during subsequent processing steps. The seed layer may comprise a layer of titanium about 1,000 Å thick followed by a layer of copper about 5,000 Å thick. The seed layer may be created using processes such as physical vapor deposition, evaporation, or PECVD processes, or metal foil laminating process, or the like, depending upon the desired materials. The seed layer may be formed to have a thickness of between about 0.3 µm and about 1 µm, such as about 0.5 µm.

Once the seed layer has been formed, a photoresist, such as a dry film photoresist, may be placed and patterned over the seed layer. In an embodiment the photoresist may be placed on the seed layer using, e.g., a lamination process or a spin coating technique to a height of about 80 µm. Once in place, the photoresist may then be patterned by exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern. In an embodiment the pattern formed into the photoresist is a pattern for a first layer of metallization 307. However, any suitable arrangement for the pattern may alternatively be utilized.

The first layer of metallization 307 is formed within the photoresist. In an embodiment the first layer of metallization 307 comprises one or more conductive materials, such as copper, tungsten, other conductive metals, or the like, and may be formed, for example, by electroplating, electroless plating, or the like. In an embodiment, an electroplating process is used wherein the seed layer and the photoresist are submerged or immersed in an electroplating solution. The seed layer surface is electrically connected to the negative side of an external DC power supply such that the seed layer functions as the cathode in the electroplating process. A solid conductive anode, such as a copper anode, is also immersed in the solution and is attached to the positive side of the power supply. The atoms from the anode are dissolved into the solution, from which the cathode, e.g., the seed layer, acquires the dissolved atoms, thereby plating the exposed conductive areas of the seed layer within the opening of the photoresist.

Once the first layer of metallization 307 has been formed using the photoresist and the seed layer, the photoresist may be removed using a suitable removal process. In an embodiment, a plasma ashing process may be used to remove the photoresist, whereby the temperature of the photoresist may be increased until the photoresist experiences a thermal decomposition and may be removed. However, any other suitable process, such as a wet strip, may alternatively be utilized. The removal of the photoresist may expose the underlying portions of the seed layer.

Once exposed a removal of the exposed portions of the seed layer may be performed. In an embodiment the exposed portions of the seed layer (e.g., those portions that are not covered by the first layer of metallization 307) may be removed by, for example, a wet or dry etching process. For example, in a dry etching process reactants may be directed towards the seed layer using the first layer of metallization 307 as a mask. In another embodiment, etchants may be sprayed or otherwise put into contact with the seed layer in order to remove the exposed portions of the seed layer.

Once the first layer of metallization 307 has been formed, a first layer of dielectric 309 is placed in order to help isolate the first layer of metallization 307. In an embodiment the first layer of dielectric 309 may be an Ajinomoto build-up film (ABF), although any suitable material, such as polybenzoxazole (PBO), polyimide, a polyimide derivative, or the like, may alternatively be utilized. The first layer of dielectric 309 may be placed using, e.g., a lamination process or a spin-coating process (depending at least in part on the material chosen), although any suitable method may alternatively be used. Once in place, the first layer of dielectric 309 may be planarized using, e.g., a CMP process, in order to expose the first layer of metallization 307 and reduce the thickness to about 35 µm.

FIG. 3B illustrates a formation of a first via 311, a second layer of dielectric 315, a second layer of metallization 313, and a third layer of dielectric 317. In an embodiment the first via 311, the second layer of dielectric 315, the second layer of metallization 313, and the third layer of dielectric 317 may each be formed in a similar fashion as described above with respect to the formation of the first layer of metallization 307 and the first layer of dielectric 309. For example, each of the first via 311 and the second layer of metallization 313 may be formed by forming a seed layer, placing and patterning a photoresist, and plating within the openings of the photoresist to form the first via 311 and the second layer of metallization 313. Once the first via 311 or the second layer of metallization 307 have been formed, they may be covered by the second layer of dielectric 315 and the third layer of dielectric 317, respectively.

In another embodiment, the second layer of dielectric 315 and the third layer of dielectric 317 may be combined into a single layer of material which is applied at one time. Once applied, a via-first or via-last dual damascene process may be performed, whereby openings for both the first via 311 and the second layer of metallization 313 are formed using, e.g., a photolithographic masking and etching process, and the openings are then filled with conductive material and planarized in order to form the first via 311 and the second layer of metallization 313.

In yet another embodiment to form the first via 311, a copper foil may be laminated onto the first layer of dielectric 309, and the copper foil may then be patterned into a desired design. Once the copper foil has been patterned, the second layer of dielectric 315 is placed over the patterned copper foil, and an opening is formed through the second layer of dielectric 315 using, e.g., either a laser drill process or a photolithographic masking and etching process to expose the underlying copper foil. After an optional desmearing process, an electroless plating process may be used to fill the openings and plate a copper pattern onto the second layer of dielectric 315. The third layer of dielectric 317 may then be applied and planarized.

Additionally, while multiple embodiments for the manufacture of the first via 311, the second layer of dielectric 315, the second layer of metallization 313, and the third layer of dielectric 317 have been described, these embodiments are intended to be illustrative only and are not intended to be limiting. Rather, any suitable processes for the formation of the first via 311, the second layer of dielectric 315, the second layer of metallization 313, and the third layer of dielectric 317 may be utilized, and all such methods are fully intended to be included within the scope of the embodiments.

FIG. 3C illustrates a formation of conductive pillars 319 and a fourth layer of dielectric 321 over the third layer of dielectric 317. In an embodiment the fourth layer of dielectric 321 may be similar to the third layer of dielectric 317 and may be applied in a similar fashion. For example, in an embodiment the fourth layer of dielectric 321 may be a material such as an ABF or PBO applied using a lamination process or a spin-coating process. However, any suitable material or process may be utilized.

Once the fourth layer of dielectric 321 has been formed and/or placed, a photoresist (not separately illustrated in FIG. 3C) may be placed over the fourth layer of dielectric 321. Once in place the photoresist is exposed and developed to form openings through the photoresist, wherein the openings are in the desired shape of the conductive pillars 319. Additionally, during the imaging and developing to form the openings through the photoresist, the sidewalls of the openings may be formed such that the sidewalls are not perpendicular with the underlying fourth layer of dielectric 321. Rather, the sidewalls are formed at an angle to the underlying fourth layer of dielectric 321 such that the shape of the opening is an inverted tapered shape as the opening extends through the photoresist.

Once the photoresist has been patterned to form the openings into the desired shape of the conductive pillars 319, the photoresist may be used as a mask to remove exposed portions of the fourth layer of dielectric 321 and expose the underlying second layer of metallization 313. In an embodiment the removal of the fourth layer of dielectric 321 is performed using, e.g., an anisotropic etching process such as a reactive ion etch that utilizes the photoresist as a mask. However, any suitable method of removing the exposed portions of the fourth layer of dielectric 321 may be utilized.

Once the second layer of metallization 313 has been exposed, the conductive pillars 319 are formed within the photoresist. In an embodiment the conductive pillars 319 comprise one or more conductive materials, such as copper, tungsten, other conductive metals, or the like, and may be formed, for example, by electroplating, electroless plating, or the like. In an embodiment, an electroplating process is used wherein the photoresist is submerged or immersed in an electroplating solution. The second layer of metallization 313 or optionally, a deposited seed layer (not separately illustrated but deposited prior to placement of the photoresist) is electrically connected to the negative side of an external DC power supply such that the second layer of metallization 313 or seed layer functions as the cathode in the electroplating process. A solid conductive anode, such as a copper anode, is also immersed in the solution and is attached to the positive side of the power supply. The atoms from the anode are dissolved into the solution, from which the cathode, e.g., the second layer of metallization 313 or seed layer, acquires the dissolved atoms, thereby plating the exposed conductive areas of the second layer of metallization or seed layer within the opening of the photoresist.

Once the conductive pillars 319 have been formed using the photoresist and either the second layer of metallization 313 or the seed layer, the photoresist may be removed using a suitable removal process. In an embodiment, a plasma ashing process may be used to remove the photoresist, whereby the temperature of the photoresist may be increased until the photoresist experiences a thermal decomposition and may be removed. However, any other suitable process, such as a wet strip, may alternatively be utilized. The removal of the photoresist may expose the underlying portions of the seed layer (if present).

If present, once the seed layer has been exposed, a removal of the exposed portions of the seed layer may be performed. In an embodiment the exposed portions of the seed layer (e.g., those portions that are not covered by the conductive pillars 319) may be removed by, for example, a wet or dry etching process. For example, in a dry etching process reactants may be directed towards the seed layer using the conductive pillars 319 as a mask. In another embodiment, etchants may be sprayed or otherwise put into contact with the seed layer in order to remove the exposed portions of the seed layer.

Additionally, by utilizing the openings through the photoresist as a mask during the formation of the conductive pillars 319, the conductive pillars 319 will take on the shape of the openings through the photoresist. For example, in an embodiment in which the openings through the photoresist have the inverted tapered shape, the conductive pillars 319 will also take on the inverted tapered shape of the openings. As such, the conductive pillars 319 may have a first pillar width $W_{P1}$ at a top of the conductive pillar 319 of between about 50 µm and about 300 µm, such as about 150 µm, and also have a second pillar width $W_{P2}$ at a bottom of the conductive pillar 319 that is less than the first pillar width $W_{P1}$, such as by being between about 50 µm and about 300 µm, such as about 100 µm. Additionally, the conductive pillars 319 may be spaced to have a first pitch $P_1$ of between about 160 µm and about 400 µm, such as about 270 m. However, any suitable dimensions may be utilized.

Additionally, once manufacturing of the ring 301 is complete, the ring 301 may be formed to have a first portion with a second height $H_2$ (without the conductive pillar 319) that is less than the first height $H_1$ of the first semiconductor device 201 (see FIG. 2). In an embodiment the second height $H_2$ may be between about 50 µm and about 300 µm, such as about 100 µm, while the conductive pillars 319 may be formed to have a third height $H_3$ (above the fourth layer of dielectric 321) of between about 10 µm and about 200 µm, such as about 10 µm. However, any suitable dimensions may be utilized.

Figure 3D:
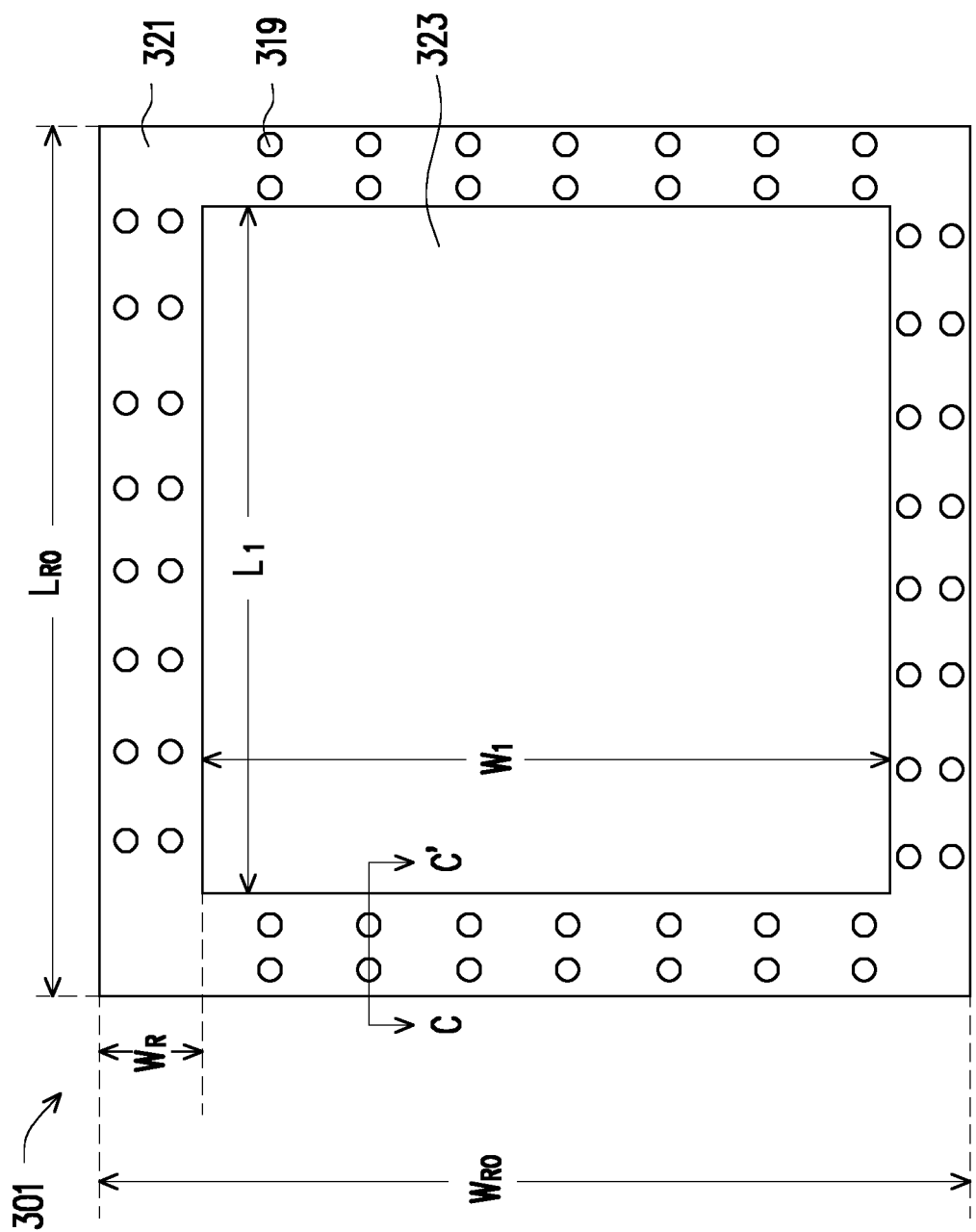

FIG. 3D illustrates a top view of the structure of FIG. 3C, with FIG. 3C illustrating a cross-sectional view of FIG. 3D along line C-C'. As illustrated in FIG. 3D, once the structure of FIG. 3C has been formed, portions of the ring 301, such as an internal portion 323 of the ring 301, may be removed in order to form the structure into the desired "ring" shape. In an embodiment the portions of the ring 301 to be removed, including the internal portion 323 of the ring 301, may be removed by applying a photoresist over the structure in order to protect those portions that are not desired to be removed (e.g., those portions comprising the conductive pillars 319) and then exposing and developing the photoresist to expose the portions desired to be removed, such as the internal portion 323 of the ring 301. Once the photoresist has been developed, the portions to be removed, including the internal portion 323, may be removed using one or more anisotropic etching process, although any suitable removal process may be utilized.

In an embodiment, after the removal of the internal portion 323, the ring 301 may have an overall ring width $W_{RO}$ of between about 3 mm and about 30 mm, such as about 12.6 mm, and an overall ring length $L_{RO}$ of between about 3 mm and about 30 mm, such as about 12.6 mm. Additionally, the ring 301 may have a ring width $W_R$ (from an exterior surface to where the internal portion 323 had previously been located) of between about 0.6 mm and about 2.5 mm, such as about 1.8 mm. As such, the removal of the internal portion 323 may leave behind an opening with an internal width $W_1$ of between about 1.4 mm and about 27.5 mm, such as about 9 mm, and an internal length $L_1$ of between about 1.4 mm and about 27.5 mm, such as about 11 mm. However, any suitable dimensions may be utilized.

In another embodiment, rather than building up the ring 301 using subsequent deposition, etching, and planarization processes, the formation of the ring 301 may be initiated using a substrate such as a silicon substrate or a glass substrate. For example, in this embodiment a silicon or glass core with a thickness of about 100 μm may be laminated with copper foil on both sides. Openings may then be formed through the core using, e.g., a laser drilling process, although any other suitable process, such as a photolithographic masking and etching process with one or more etches, may also be utilized. After a de-smearing process, an electroless plating process plates sidewalls of the openings with a conductive material such as copper, but does not completely fill the openings. A dry film photoresist may then be laminated, exposed, and developed, which dry film photoresist is then used as a mask in a subsequent plating process to fill the openings and form a conductive pattern. Another photoresist is applied, exposed, and developed to expose the conductive material within the openings, and an Electroless Nickel Electroless Palladium Immersion Gold (ENEPIG) process is utilized to coat the conductive materials within the openings and form through substrate vias (TSVs) that extend through the core.

Once the TSVs have been formed through the core, the conductive pillars 319 may be formed in electrical connection with the TSVs. In an embodiment the conductive pillars 319 are formed as described above with respect to FIG. 3C. For example, a photoresist is applied and developed in the desired shape of the conductive pillars 319 (e.g., an inverted tapered shape) and the conductive pillars 319 are plated within the photoresist. However, any suitable method of forming the conductive pillars 319 may be utilized.

Additionally, after the formation of the conductive pillars 319, the internal portion 323 may be removed to form the core into the ring shape. In an embodiment the internal portion 323 is removed as described above, such as through the use of a photolithographic masking and etching process. However, any suitable method of removal may also be utilized.

In embodiments in which the ring 301 utilizes a silicon substrate as the core, the thickness of the ring 301 (e.g., the second height $H_2$) can achieve a better thermal performance with the first semiconductor device 201. For example, in embodiments in which the ring 301 is utilized within mobile applications (e.g., within a cellular phone), the inclusion of silicon can create another path for heat to be removed from the first semiconductor device 201 (e.g., the SOC). For example, heat generated by the first semiconductor device 201 may be removed not only through, e.g., a first side of the first semiconductor device 201 (e.g., through external connections) and a second side of the first semiconductor device 201 (e.g., through a silicon paste), but can also be removed through the ring 301, allowing for an overall larger heat removal from the first semiconductor device 201.

Figure 3E:
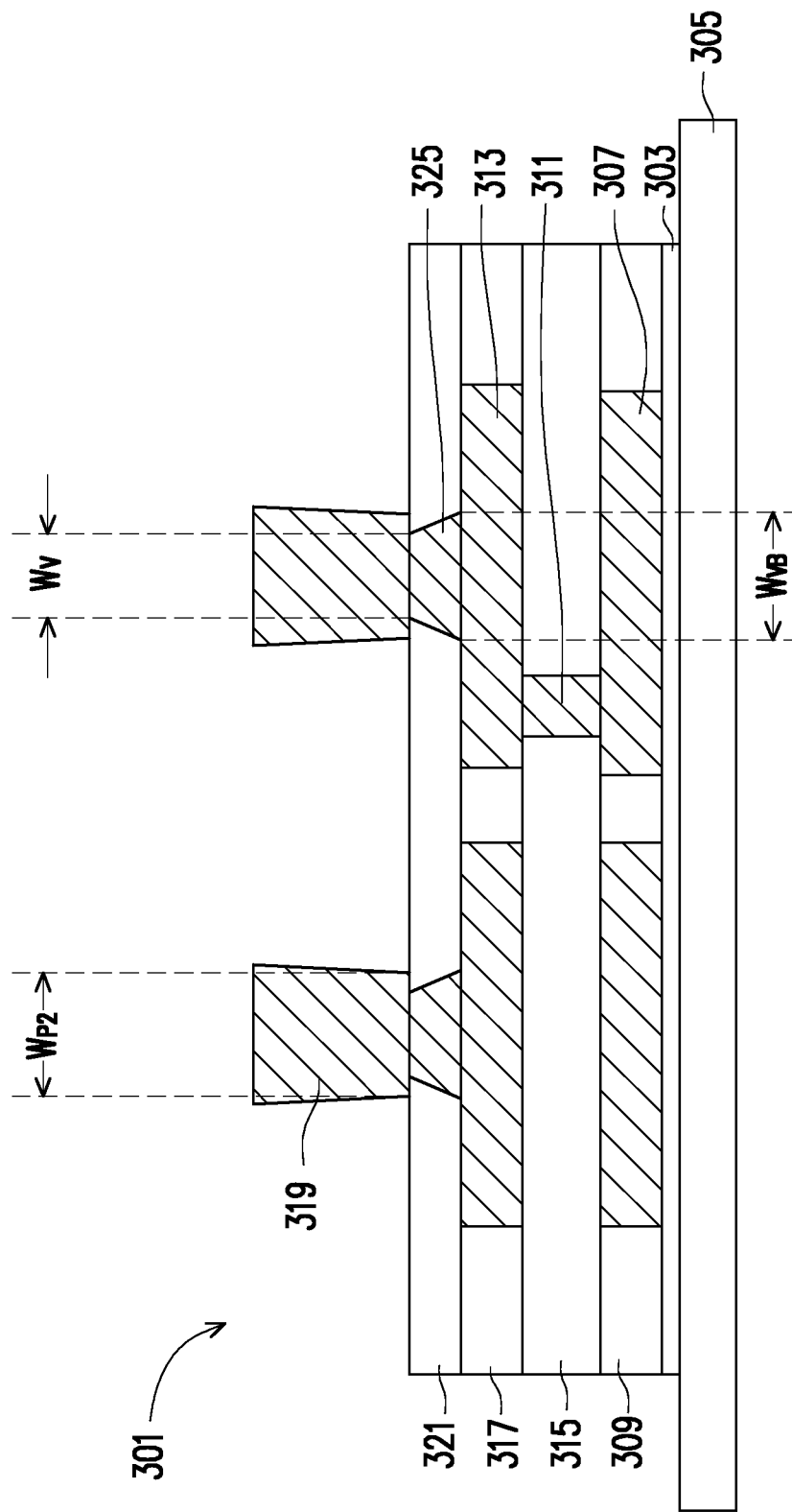

FIG. 3E illustrates another embodiment in which, instead of forming the conductive pillars 319 through the fourth layer of dielectric 321, a top via 325 is formed to extend through the fourth layer of dielectric 321 and connects the conductive pillars 319 to the second layer of metallization 313. In an embodiment the top via 325 may be formed prior to the placement of the fourth layer of dielectric 321 by plating a layer of a conductive material such as copper, and then patterning the layer of conductive material to form the top via 325. Once the top via 325 has been formed, the fourth layer of dielectric 321 may be formed or placed over the top via 325 and then planarized.

However, by forming the top via 325 separately from the conductive pillars 319, the top via 325 may have a different width than the conductive pillars at a top of the fourth layer of dielectric 321. For example, in a particular embodiment, the top via 325 may have a via width $W_V$ that is less than the second pillar width $W_{P2}$, such as by having a via width $W_V$ of between about 5 μm and about 50 μm, such as about 30 μm. Additionally, in some embodiments the top via 325 may have a tapered shape such that, while the top via 325 may have the via width $W_V$ at the top of the top via 325, the top via 325 may also have a bottom via width $W_{VB}$ of between about 10 μm and about 100 μm, such as about 50 μm. However, any suitable dimensions may be utilized.

Figure 4:
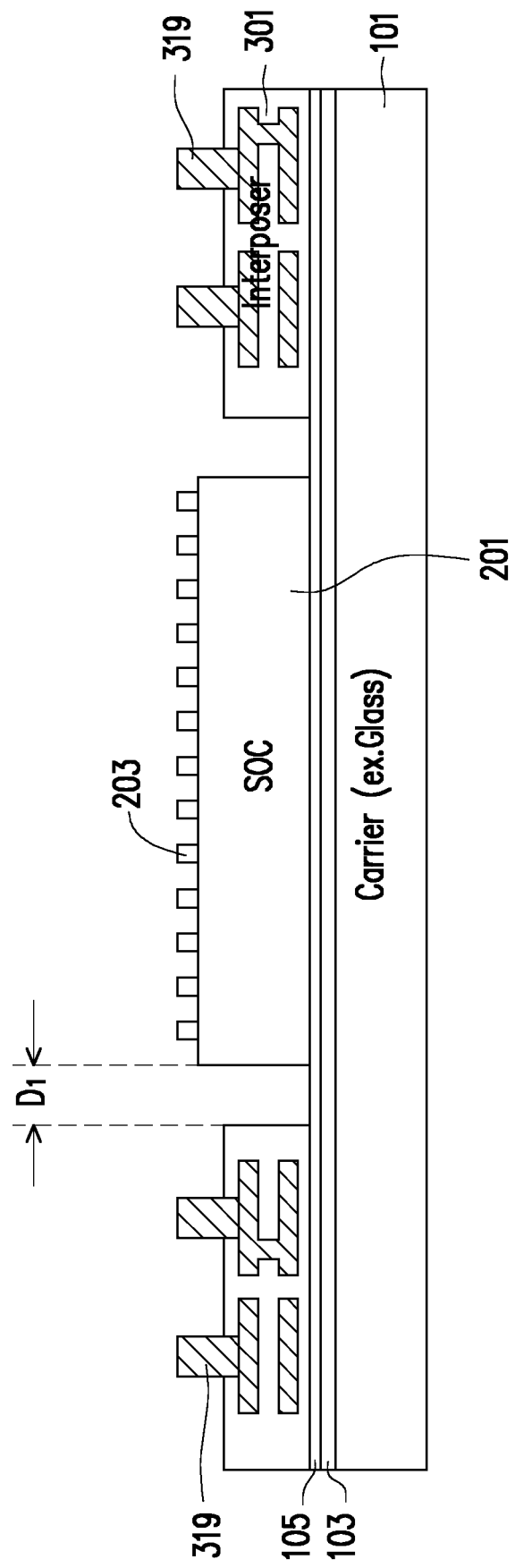
FIG. 4 illustrates a placement of the first semiconductor device and the ring onto the carrier in accordance with some embodiments.

FIG. 4 illustrates a placement of the first semiconductor device 201 and the ring 301 onto the first die attach film 105. In an embodiment the first semiconductor device 201 and the ring 301 may be placed onto the first die attach film 105 using, e.g., a pick and place process, in a face-up orientation. However, any suitable method of placing the first semiconductor device 201 and the ring 301 onto the first die attach film 105 may also be utilized.

In an embodiment the first semiconductor device 201 and the ring 301 may be placed onto the first carrier substrate 101 with enough space between the first semiconductor device 201 and the ring 301 to allow for an encapsulant while still being close enough to allow for an efficient heat transfer through the encapsulant and to the ring 301 during operation of the first semiconductor device 201. In a particular embodiment the first semiconductor device 201 and the ring 301 may be spaced apart from each other by a first distance $D_1$ of between about 50 μm and about 400 μm, such as about 100 μm. However, any suitable distance may be utilized.

By utilizing the ring 301 along with the first semiconductor device 201, a single step (e.g., the pick-and-place process utilized to place the ring 301 and the first semiconductor device 201) may be utilized over the first die attach film 105 to provide a connection from one side of the first semiconductor device 201 to the other. Such a single step over the first die attach film 105 can reduce the number of steps that are utilized, allowing for a smaller time of manufacture and a larger throughput. Additionally, by using the ring 301 with internal conductive structures, a lower fan-out ratio such as less than about 2 may be achieved while also reducing or eliminating the problem of via collapse during subsequent molding processes.

Figure 5:
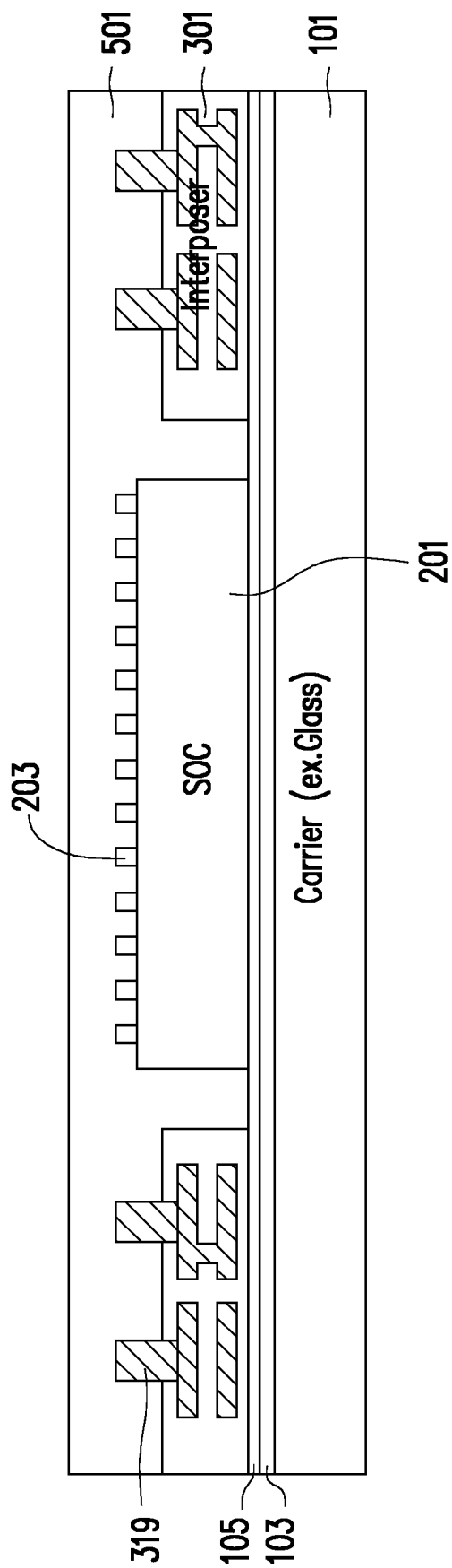
FIG. 5 illustrates an encapsulation of the semiconductor die and the ring in accordance with some embodiments.

FIG. 5 illustrates an encapsulation of the first semiconductor device 201 and the ring 301. The encapsulation may be performed in a molding device (not individually illustrated in FIG. 5), which may comprise a top molding portion and a bottom molding portion separable from the top molding portion. When the top molding portion is lowered to be adjacent to the bottom molding portion, a molding cavity may be formed for the first carrier substrate 101, the first semiconductor device 201, and the ring 301.

During the encapsulation process the top molding portion may be placed adjacent to the bottom molding portion, thereby enclosing the first carrier substrate 101, the first semiconductor device 201, and the ring 301 within the molding cavity. Once enclosed, the top molding portion and the bottom molding portion may form an airtight seal in order to control the influx and outflux of gasses from the molding cavity. Once sealed, an encapsulant 501 may be placed within the molding cavity. The encapsulant 501 may be a molding compound resin such as polyimide, PPS, PEEK, PES, a heat resistant crystal resin, combinations of these, or the like. The encapsulant 501 may be placed within the molding cavity prior to the alignment of the top molding portion and the bottom molding portion, or else may be injected into the molding cavity through an injection port.

Once the encapsulant 501 has been placed into the molding cavity such that the encapsulant 501 encapsulates the first carrier substrate 101, the first semiconductor device 201, and the ring 301, the encapsulant 501 may be cured in order to harden the encapsulant 501 for optimum protection. While the exact curing process is dependent at least in part on the particular material chosen for the encapsulant 501, in an embodiment in which molding compound is chosen as the encapsulant 501, the curing could occur through a process such as heating the encapsulant 501 to between about 100° C. and about 130° C., such as about 125° C. for about 60 sec to about 3600 sec, such as about 600 sec. Additionally, initiators and/or catalysts may be included within the encapsulant 501 to better control the curing process.

However, as one having ordinary skill in the art will recognize, the curing process described above is merely an exemplary process and is not meant to limit the current embodiments. Other curing processes, such as irradiation or even allowing the encapsulant 501 to harden at ambient temperature, may alternatively be used. Any suitable curing process may be used, and all such processes are fully intended to be included within the scope of the embodiments discussed herein.

Additionally, by utilizing the ring 301 instead of simply using vias without the remainder of the ring 301, the ring 301 will take up more space than individual vias can. As such, less material of the encapsulant 501 can be utilized during the encapsulation process to encapsulant the same amount of space, thereby saving costs on material. The use of the ring 301 also provides additional structural support, helping to reduce or prevent excessive warpage from occurring during subsequent processing.

Figure 6:
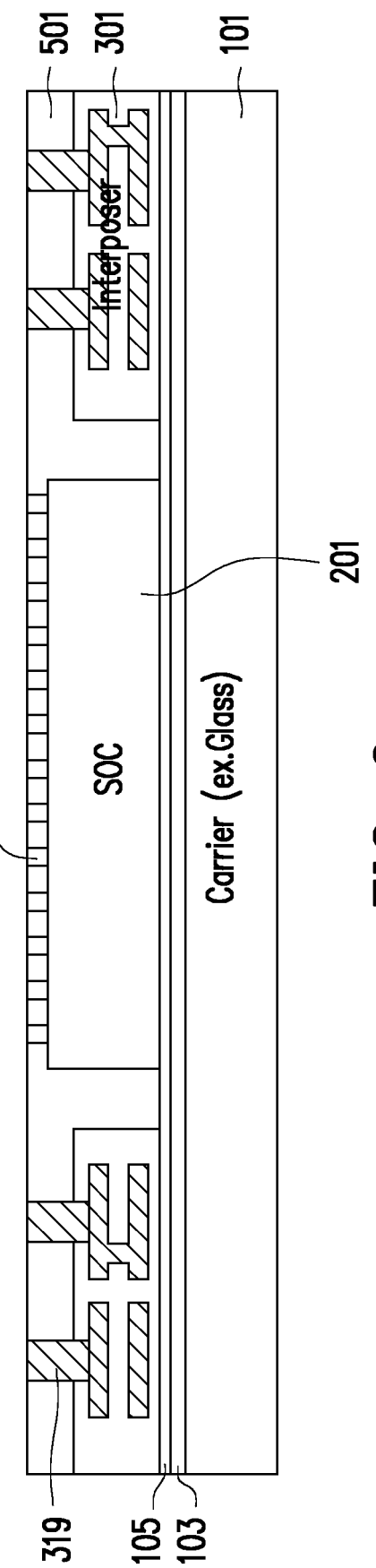
FIG. 6 illustrates a planarization of the encapsulant in accordance with some embodiments.

FIG. 6 illustrates a thinning of the encapsulant 501 in order to expose the first semiconductor device 201 and the ring 301 for further processing. The thinning may be performed, e.g., using a mechanical grinding or chemical mechanical polishing (CMP) process whereby chemical etchants and abrasives are utilized to react and grind away the encapsulant 501, the first semiconductor device 201 and the ring 301 until the conductive pillars 319 (on the ring 301) and the first external connectors 203 (on the first semiconductor device 201) have been exposed. As such, the first semiconductor device 201 and the ring 301 may have a planar surface that is also planar with the encapsulant 501.

In another embodiment in which the polymer layer 205 is utilized, the CMP process may be used to planarize the encapsulant 501 with the polymer layer 205. In this embodiment the conductive pillars 319 will be planar with the polymer layer 205 while the polymer layer 205 still covers the underlying first external connectors 203 (on the first semiconductor device 201). Further, both the polymer layer 205 and the conductive pillars 319 are planar with the encapsulant 501.

However, while the CMP process described above is presented as one illustrative embodiment, it is not intended to be limiting to the embodiments. Any other suitable removal process may be used to thin the encapsulant 501, the first semiconductor device 201, and the ring 301. For example, a series of chemical etches may be utilized. This process and any other suitable process may be utilized to thin the encapsulant 501, the first semiconductor device 201, and the ring 301, and all such processes are fully intended to be included within the scope of the embodiments.

Figure 7:
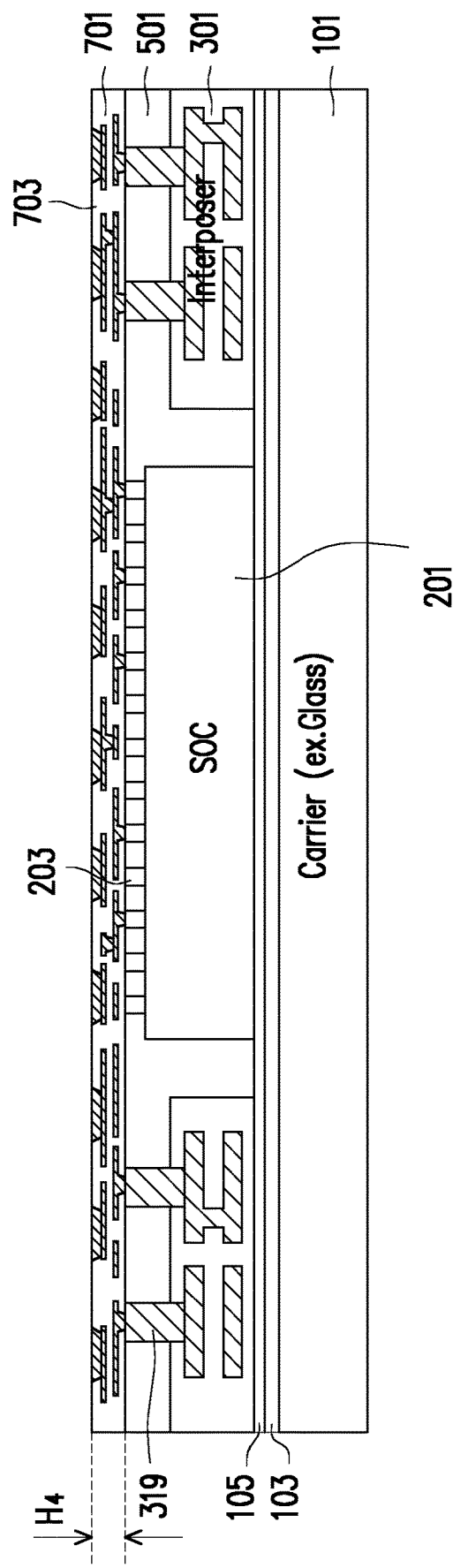
FIG. 7 illustrates a formation of a redistribution layer in accordance with some embodiments.

FIG. 7 illustrates a formation of the RDL 701 in order to interconnect the first semiconductor device 201, the ring 301, and second external connectors 801. In an embodiment a first dielectric layer (not separately illustrated in FIG. 7) is formed to cover the encapsulant 501, the first semiconductor device 201, and the ring 301. The first dielectric layer is then patterned using, e.g., a photolithographic masking and etching process to expose the underlying conductive elements of the first semiconductor device 201 and the ring 301. In embodiments in which the polymer layer 205 is present, the first dielectric layer may then be used as a mask to pattern the polymer layer 205 and expose the first external connectors 203.

Once the first external connectors 203 and the conductive pillars 319 have been exposed, the RDL 701 may be formed by initially forming a seed layer (not shown) of a titanium copper alloy through a suitable formation process such as CVD or sputtering. A photoresist (also not shown) may then be formed to cover the seed layer, and the photoresist may then be patterned to expose those portions of the seed layer that are located where the RDL 701 is desired to be located.

Once the photoresist has been formed and patterned, a conductive material, such as copper, may be formed on the seed layer through a deposition process such as plating. The conductive material may be formed to have a thickness of between about 1 μm and about 10 μm, such as about 5 μm. However, while the material and methods discussed are suitable to form the conductive material, these materials are merely exemplary. Any other suitable materials, such as AlCu or Au, and any other suitable processes of formation, such as CVD or PVD, may be used to form the RDL 701.

Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

FIG. 7 also illustrates a formation of a first passivation layer 703 over the RDL 701 in order to provide protection and isolation for the RDL 701 and the other underlying structures. In an embodiment the first passivation layer 703 may be polybenzoxazole (PBO), ABF film, although any suitable material, such as polyimide or a polyimide derivative, may be utilized. In another particular embodiment the first passivation layer 703 may be formed of the same material as the encapsulant 501. The first passivation layer 703 may be placed using, e.g., a spin-coating process or film lamination process to a thickness of between about 5 μm and about 25 μm, such as about 7 μm, although any suitable method and thickness may alternatively be used.

Once the RDL 701 and the first passivation layer 703 have been formed, the process may be repeated to form another RDL 701 and another first passivation layer 703. This process may be repeated as many times as desired to form any suitable number of conductive and passivation layers, such as three RDL 701 layers. However, any suitable number of layers may be utilized.

In an embodiment the RDL 701 is formed to have a height suitable for the overall design. In an embodiment in which the first semiconductor device 201 is to be used in a mobile application, the RDL 701 may be formed to have a fourth height H₄ of between about 10 µm and about 50 µm, such as about 25 µm. However, any suitable height may be utilized.

By using the RDL 701 to interconnect the first semiconductor device 201 and the ring 301, the position of electrical connections to the underlying ring 301 and first semiconductor device 201 may be modified as desired. Additionally, by utilizing the ring 301 and the ring 301, the overall pin count of the device may be increased, such as by being larger than 1000. However, any suitable pin count, whether larger or smaller than 1000, may be utilized.

Figure 8:
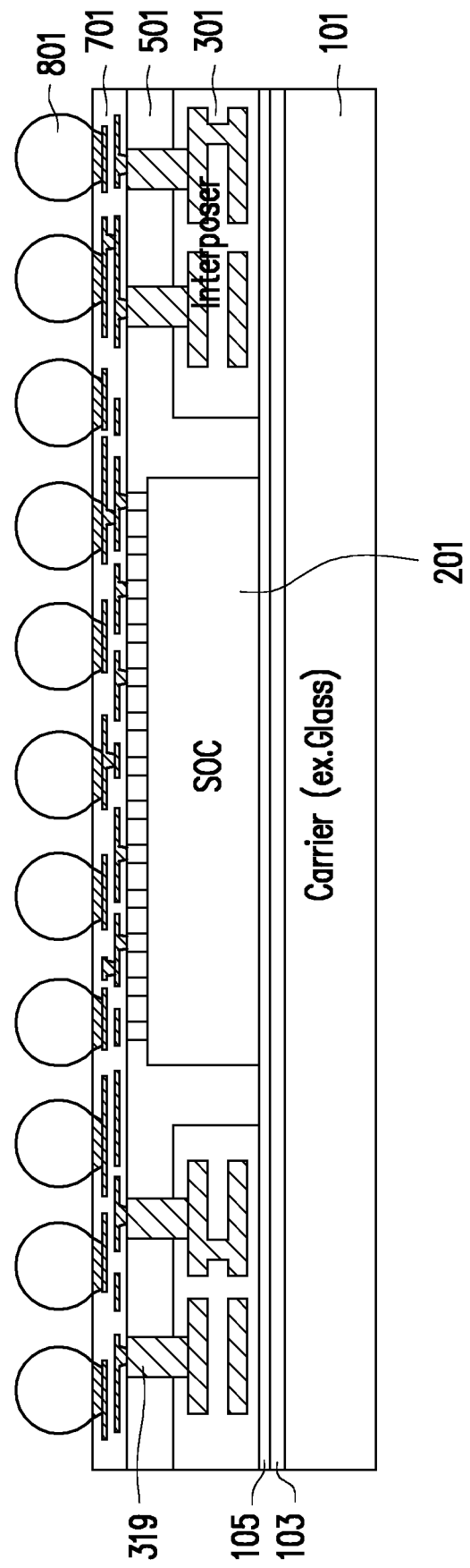
FIG. 8 illustrates a formation of external connectors in accordance with some embodiments.

FIG. 8 illustrates a formation of second external connectors 801 to make electrical contact with the RDL 701. In an embodiment a top passivation layer (not separately illustrated in FIG. 8) is placed on the RDL 701, and may be similar to the first passivation layer 703. After the top passivation layer has been formed, an opening may be made through the top passivation layer by removing portions of the top passivation layer to expose at least a portion of the underlying RDL 701. The opening allows for contact between the RDL 701 and the second external connectors 801. The opening may be formed using a suitable photolithographic mask and etching process, although any suitable process to expose portions of the RDL 701 may be used.

In an embodiment the second external connectors 801 may be placed on the RDL 701 through the top passivation layer and may be a ball grid array (BGA) which comprises a eutectic material such as solder, although any suitable materials may alternatively be used. Optionally, an underbump metallization may be utilized between the second external connectors 801 and the RDL 701. In an embodiment in which the second external connectors 801 are solder bumps, the second external connectors 801 may be formed using a ball drop method, such as a direct ball drop process. Alternatively, the solder bumps may be formed by initially forming a layer of tin through any suitable method such as evaporation, electroplating, printing, solder transfer, and then performing a reflow in order to shape the material into the desired bump shape. Once the second external connectors 801 have been formed, a test may be performed to ensure that the structure is suitable for further processing.

Figure 9:
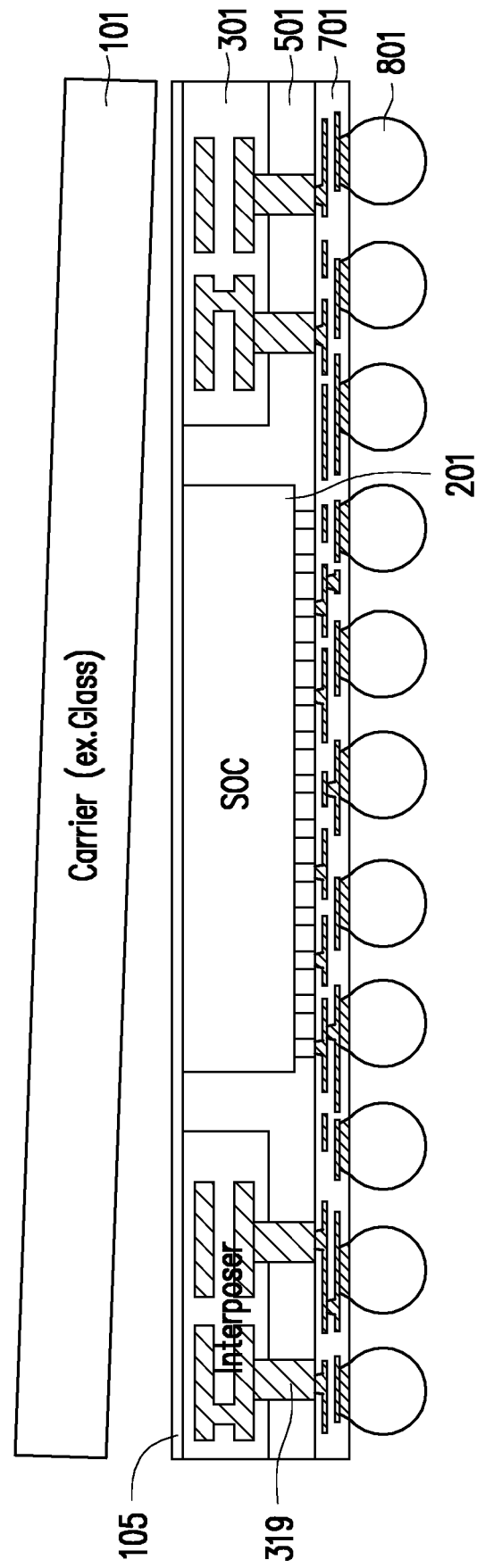
FIG. 9 illustrates a removal of the carrier in accordance with some embodiments.

FIG. 9 illustrates a debonding of the first carrier substrate 101 from the first semiconductor device 201 and the ring 301. In an embodiment the second external connectors 801 and, hence, the structure including the first semiconductor device 201 and the ring 301, may be attached to a ring structure (not separately illustrated). The ring structure may be a metal ring intended to provide support and stability for the structure during and after the debonding process. In an embodiment the second external connectors 801, the first semiconductor device 201, and the ring 301 are attached to the ring structure using, e.g., a ultraviolet tape, although any other suitable adhesive or attachment may alternatively be used.

Once the second external connectors 801 and, hence, the structure including the first semiconductor device 201 and the ring 301 are attached to the ring structure, the first carrier substrate 101 may be debonded from the structure including the first semiconductor device 201 and the ring 301 using, e.g., a thermal process to alter the adhesive properties of the adhesive layer 103. In a particular embodiment an energy source such as an ultraviolet (UV) laser, a carbon dioxide ($CO_2$) laser, or an infrared (IR) laser, is utilized to irradiate and heat the adhesive layer 103 until the adhesive layer 103 loses at least some of its adhesive properties. Once performed, the first carrier substrate 101 and the adhesive layer 103 may be physically separated and removed from the structure comprising the second external connectors 801, the first semiconductor device 201, and the ring 301.

Figure 10:
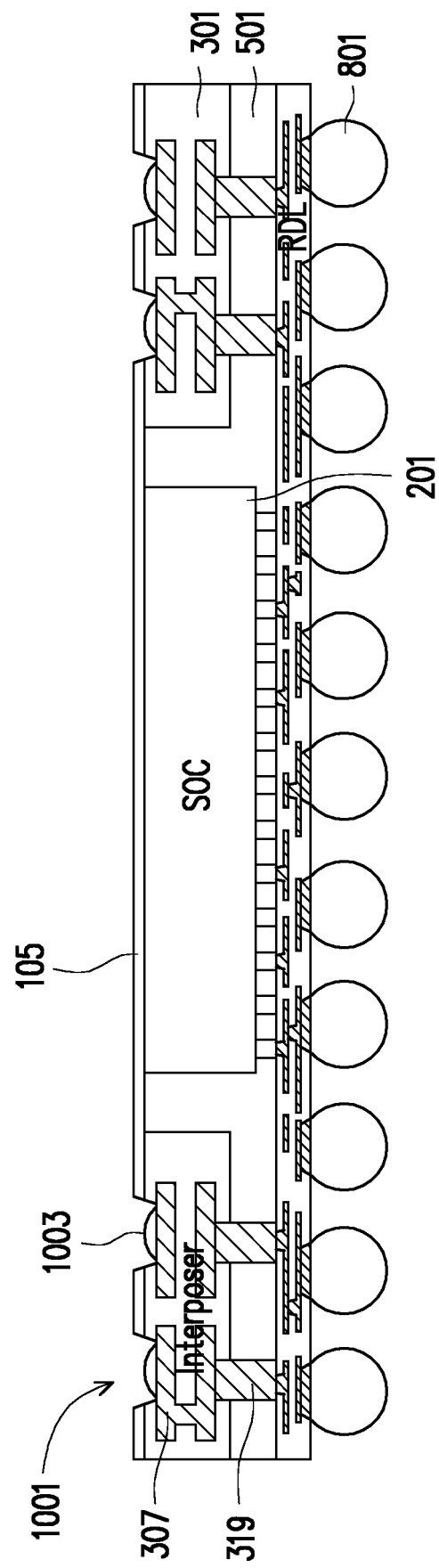
FIG. 10 illustrates a patterning of the adhesive layer in accordance with some embodiments.

FIG. 10 illustrates a pad reveal which comprises a patterning of the first die attach film 105 in order to form first openings 1001 and expose the first layer of metallization 307. In an embodiment the first die attach film 105 may be patterned using, e.g., a dry etching process or a laser drilling method. Additionally, once the first die attach film 105 has been patterned, the etching process (or a separate etching process) may be continued in order to remove portions of the polymer layer 303 and expose the first layer of metallization 307. However, any suitable process may be utilized to expose the first layer of metallization 307.

Optionally, after the first die attach film 105 has been removed, backside ball pads 1003 or other underbump metallizations may be placed. In an embodiment the backside ball pads 1003 may comprise a conductive material such as solder on paste or an organic solderability preservative (OSP), although any suitable material may alternatively be utilized. In an embodiment the backside ball pads 1003 may be applied using a stencil, although any suitable method of application may alternatively be utilized, and then reflowed in order to form a bump shape.

Figure 11:
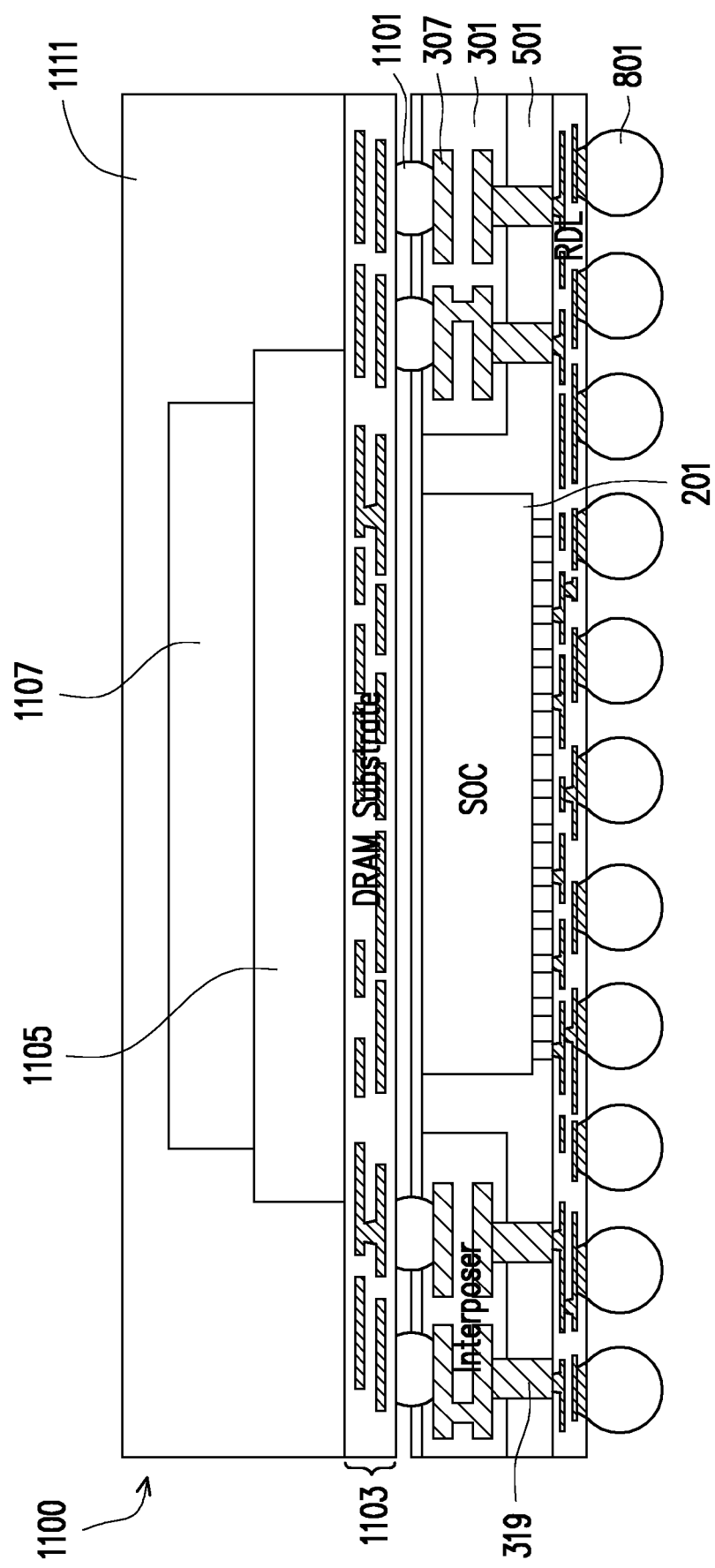
FIG. 11 illustrates a bonding of a first package in accordance with some embodiments.

FIG. 11 illustrates a placement of third external connections 1101 in physical contact with the first layer of metallization 307 (in embodiments in which the backside ball pads 1003 are not present). In an embodiment the third external connections 1101 may be formed to provide an external connection between the first layer of metallization 307 and, e.g., a first package 1100. The third external connections 1101 may be contact bumps such as microbumps or controlled collapse chip connection (C4) bumps and may comprise a material such as tin, or other suitable materials, such as solder on past, silver, or copper. In an embodiment in which the third external connections 1101 are tin solder bumps, the third external connections 1101 may be formed by initially forming a layer of tin through any suitable method such as evaporation, electroplating, printing, solder transfer, ball placement, etc, to a thickness of, e.g., about 100 µm. Once a layer of tin has been formed on the structure, a reflow is performed in order to shape the material into the desired bump shape.

FIG. 11 also illustrates a bonding of the third external connections 1101 to the first package 1100. In an embodiment the first package 1100 may comprise a package substrate 1103, a second semiconductor device 1105, a third semiconductor device 1107 (bonded to the second semiconductor device 1105), contact pads (for electrical connection to the third external connections 1101), and a second encapsulant 1111. In an embodiment the package substrate 1103 may be, e.g., a packaging substrate comprising internal interconnects (e.g., through substrate vias) to connect the second semiconductor device 1105 and the third semiconductor device 1107 to the third external connections 1101.

Alternatively, the package substrate 1103 may be an interposer used as an intermediate substrate to connect the second semiconductor device 1105 and the third semiconductor device 1107 to the third external connections 1101. In this embodiment the package substrate 1103 may be, e.g., a silicon substrate, doped or undoped, or an active layer of a silicon-on-insulator (SOI) substrate. However, the package substrate 1103 may alternatively be a glass substrate, a ceramic substrate, a polymer substrate, or any other substrate that may provide a suitable protection and/or interconnection functionality. These and any other suitable materials may alternatively be used for the package substrate 1103.

The second semiconductor device 1105 may be a semiconductor device designed for an intended purpose such as being a memory die (e.g., a DRAM die), a logic die, a central processing unit (CPU) die, a passive integrated device, a radio frequency module, combinations of these, or the like. In an embodiment the second semiconductor device 1105 comprises integrated circuit devices, such as transistors, capacitors, inductors, resistors, first metallization layers (not shown), and the like, therein, as desired for a particular functionality. In an embodiment the second semiconductor device 1105 is designed and manufactured to work in conjunction with or concurrently with the first semiconductor device 201.

The third semiconductor device 1107 may be similar to the second semiconductor device 1105. For example, the third semiconductor device 1107 may be a semiconductor device designed for an intended purpose (e.g., a DRAM die) and comprising integrated circuit devices for a desired functionality. In an embodiment the third semiconductor device 1107 is designed to work in conjunction with or concurrently with the first semiconductor device 201 and/or the second semiconductor device 1105.

The third semiconductor device 1107 may be bonded to the second semiconductor device 1105. In an embodiment the third semiconductor device 1107 is only physically bonded with the second semiconductor device 1105, such as by using an adhesive. In this embodiment the third semiconductor device 1107 and the second semiconductor device 1105 may be electrically connected to the package substrate 1103 using, e.g., wire bonds (not separately illustrated), although any suitable electrical bonding may be utilized.

In another embodiment, the third semiconductor device 1107 may be bonded to the second semiconductor device 1105 both physically and electrically. In this embodiment the third semiconductor device 1107 may comprise external connections (not separately illustrated in FIG. 11) that connect with external connection (also not separately illustrated in FIG. 11) on the second semiconductor device 1105 in order to interconnect the third semiconductor device 1107 with the second semiconductor device 1105.

The contact pads may be formed on the package substrate 1103 to form electrical connections between the second semiconductor device 1105 and, e.g., the third external connections 1101. In an embodiment the contact pads may be formed over and in electrical contact with electrical routing (such as through substrate vias) within the package substrate 1103. The contact pads may comprise aluminum, but other materials, such as copper, may alternatively be used. The contact pads may be formed using a deposition process, such as sputtering, to form a layer of material (not shown) and portions of the layer of material may then be removed through a suitable process (such as photolithographic masking and etching) to form the contact pads. However, any other suitable process may be utilized to form the contact pads.

The second encapsulant 1111 may be used to encapsulate and protect the second semiconductor device 1105, the third semiconductor device 1107, and the package substrate 1103. In an embodiment the second encapsulant 1111 may be a molding compound and may be placed using a molding device (not illustrated in FIG. 11). For example, the package substrate 1103, the second semiconductor device 1105, and the third semiconductor device 1107 may be placed within a cavity of the molding device, and the cavity may be hermetically sealed. The second encapsulant 1111 may be placed within the cavity either before the cavity is hermetically sealed or else may be injected into the cavity through an injection port. In an embodiment the second encapsulant 1111 may be a molding compound resin such as polyimide, PPS, PEEK, PES, a heat resistant crystal resin, combinations of these, or the like.

Once the second encapsulant 1111 has been placed into the cavity such that the second encapsulant 1111 encapsulates the region around the package substrate 1103, the second semiconductor device 1105, and the third semiconductor device 1107, the second encapsulant 1111 may be cured in order to harden the second encapsulant 1111 for optimum protection. While the exact curing process is dependent at least in part on the particular material chosen for the second encapsulant 1111, in an embodiment in which molding compound is chosen as the second encapsulant 1111, the curing could occur through a process such as heating the second encapsulant 1111 to between about 100° C. and about 130° C., such as about 125° C. for about 60 sec to about 3000 sec, such as about 600 sec. Additionally, initiators and/or catalysts may be included within the second encapsulant 1111 to better control the curing process.

However, as one having ordinary skill in the art will recognize, the curing process described above is merely an exemplary process and is not meant to limit the current embodiments. Other curing processes, such as irradiation or even allowing the second encapsulant 1111 to harden at ambient temperature, may be used. Any suitable curing process may be used, and all such processes are fully intended to be included within the scope of the embodiments discussed herein.

Once the third external connections 1101 have been formed, the third external connections 1101 are aligned with and placed into physical contact with the contact pads, and a bonding is performed. For example, in an embodiment in which the third external connections 1101 are solder bumps, the bonding process may comprise a reflow process whereby the temperature of the third external connections 1101 is raised to a point where the third external connections 1101 will liquefy and flow, thereby bonding the first package 1100 to the third external connections 1101 once the third external connections 1101 resolidifies. Optionally, an underfill material or solder paste may be placed between the first package 1100 and the encapsulant 501.

FIG. 11 also illustrates a singulation process to separate the first semiconductor device 201 from other semiconductor devices that were placed on the first carrier substrate 101. In an embodiment the singulation may be performed by using a saw blade (not separately illustrated) to slice through the encapsulant 501. However, as one of ordinary skill in the art will recognize, utilizing a saw blade for the singulation is merely one illustrative embodiment and is not intended to be limiting. Any method for performing the singulation, such as utilizing one or more etches, may be utilized. These methods and any other suitable methods may be utilized to singulate the first semiconductor device 201.

In an embodiment, a method of manufacturing a semiconductor device includes placing an adhesive layer over a carrier; placing a first semiconductor device onto the carrier, the first semiconductor device having a first thickness; placing a first substrate onto the carrier, the first substrate having a first surface planar with the first semiconductor device and having a second thickness less than the first thickness, wherein a conductive pillar is in physical contact with the first substrate; and an encapsulant in physical contact with each of the first substrate, the conductive pillar, and the first semiconductor device. In an embodiment, the method further includes forming a first redistribution layer connecting the conductive pillar with external connections of the first semiconductor device. In an embodiment, the first redistribution layer has a thickness of between about 10 μm to about 50 μm. In an embodiment, the first substrate is a ring which encircles the first semiconductor device. In an embodiment, the conductive pillar extends away from the first substrate a distance of between about 10 μm and about 200 m. In an embodiment, the first substrate has a thickness of between about 50 μm and about 300 μm. In an embodiment, the first semiconductor device is a system on chip semiconductor device.

In another embodiment, a method of manufacturing a semiconductor device includes forming an interposer with conductive routing; plating conductive pillars onto the interposer and in electrical connection with the conductive routing; removing a portion of the interposer to form a ring; placing the ring onto a first carrier substrate; placing a first semiconductor device onto the first carrier substrate, wherein after the placing the ring and the placing the first semiconductor device the ring surrounds the first semiconductor device in a top down view; filling a space between the first semiconductor device and the ring with an encapsulant, wherein after the filling the space the encapsulant covers a sidewall of the conductive pillars; forming a redistribution layer over a first side of the encapsulant, wherein the redistribution layer is in physical contact with both the conductive pillars and external connections of the first semiconductor device; and attaching a first package to a second side of the encapsulant opposite the first side. In an embodiment, the first package is a memory package. In an embodiment, the forming the interposer comprises sequentially building up layers of conductive and dielectric materials onto a second carrier substrate different from the first carrier substrate. In an embodiment, the forming the interposer comprises forming an opening fully through a silicon substrate. In an embodiment, the forming the interposer comprises forming an opening fully through a glass substrate. In an embodiment, the plating the conductive pillars further includes placing a photoresist onto the interposer; patterning the photoresist to expose a portion of the conductive routing; and plating conductive material onto the conductive routing through the photoresist. In an embodiment, the plating the conductive pillars forms a reversed tapered shape.

In another embodiment, a semiconductor device includes a semiconductor device embedded within an encapsulant; an interposer embedded within the encapsulant, wherein the interposer has a first portion and a conductive pillar extending away from the first portion, the conductive pillar having an inverted tapered shape, the first portion having a first thickness less than a second thickness of the semiconductor device, the interposer surrounding the semiconductor device; a redistribution layer over a first side of the encapsulant, the redistribution layer electrically connecting the conductive pillar to the semiconductor device; and a first package located on an opposite side of the encapsulant from the redistribution layer, the first package connected to the semiconductor device through the first portion of the interposer and the conductive pillar. In an embodiment, the conductive pillar has a height of between about 10 μm and about 200 μm. In an embodiment, the first portion of the interposer has a first height that is less than a second height of the semiconductor device. In an embodiment, the first portion comprises a silicon core. In an embodiment, the first portion comprises glass. In an embodiment, the semiconductor device has a first surface planar with a second surface of the first portion of the interposer and wherein the semiconductor device has a third surface planar with a fourth surface of the conductive pillar, the first surface being opposite the third surface.

In another embodiment, a method includes attaching an integrated circuit die to a carrier, the integrated circuit die having a first thickness; attaching an interposer to the carrier, the interposer including a substrate and a conductive pillar in physical contact with the substrate, the substrate having a second thickness less than the first thickness, a bottommost surface of the substrate being level with a bottommost surface of the integrated circuit die, the bottommost surface of the substrate and the bottommost surface of the integrated circuit die facing the carrier; and forming an encapsulant in physical contact with a sidewall of the substrate, a sidewall of the conductive pillar, and a sidewall of the integrated circuit die, wherein a topmost surface of the conductive pillar is level with a topmost surface of the encapsulant, and wherein the topmost surface of the conductive pillar and the topmost surface of the encapsulant face away from the carrier.

In another embodiment, a method includes forming a substrate with conductive routing; plating conductive pillars onto the substrate and in electrical contact with the conductive routing; removing a portion of the substrate to form a hole in the substrate; after forming the hole in the substrate, attaching the substrate to a carrier; attaching an integrated circuit die to the carrier through the hole in the substrate; filling the hole in the substrate with an encapsulant, the encapsulant being in physical contact with sidewalls of the conductive pillars; and forming a redistribution layer over the encapsulant, the redistribution layer being electrically coupled to the conductive pillars and the integrated circuit die.

In another embodiment, a semiconductor device includes an integrated circuit die embedded within an encapsulant; an interposer embedded within the encapsulant, wherein the interposer includes a substrate and a conductive pillar extending away from the substrate, the substrate having a first thickness less than a second thickness of the integrated circuit die, the conductive pillar having a height less than a third thickness of the encapsulant, the substrate of the interposer surrounding the integrated circuit die; and a redistribution layer over the encapsulant, the redistribution layer being in physical contact with the conductive pillar.

In another embodiment, a semiconductor device includes an interposer embedded within an encapsulant, wherein the interposer includes a substrate and a conductive pillar extending away from the substrate, a first surface of the substrate being level with a first surface of the encapsulant, the conductive pillar having a height less than a thickness of the encapsulant, the substrate of the interposer surrounding a first portion of the encapsulant; and a redistribution structure over the encapsulant, the redistribution structure being in physical contact with the conductive pillar, wherein the first surface of the substrate and the first surface of the encapsulant face away from the redistribution structure.

In another embodiment, a semiconductor device includes an interposer including a substrate and a conductive pillar extending away from the substrate, the substrate comprising a hole; an encapsulant extending into the hole of the substrate, a first surface of the substrate being level with a first surface of the encapsulant, the conductive pillar having a height less than a first thickness of the encapsulant, the substrate having a second thickness less than the first thickness of the encapsulant; and a redistribution structure over and in physical contact with the encapsulant, the redistribution structure being in electrical contact with the conductive pillar, wherein the first surface of the substrate and the first surface of the encapsulant face away from the redistribution structure.

In another embodiment, a method includes attaching an interposer to a carrier, the interposer including a substrate and a conductive pillar in physical contact with the substrate, the substrate including a hole, a first portion of the carrier being exposed through the hole; and encapsulating the interposer with an encapsulant, the encapsulant extending along and being in physical contact with a sidewall of the hole and a sidewall of the conductive pillar, wherein a thickness of the substrate is less than a thickness of the encapsulant, wherein a height of the conductive pillar is less than the thickness of the encapsulant, wherein a topmost surface of the conductive pillar is level with a topmost surface of the encapsulant, and wherein the topmost surface of the conductive pillar and the topmost surface of the encapsulant face away from the carrier.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
 a redistribution structure comprising a conductive structure;
 a cavity substrate on a first side of the redistribution structure, the cavity substrate having a first substrate and a pillar, the first substrate having a cavity;
 an electronic component on the redistribution structure and in the cavity, wherein the electronic component is electrically coupled with the conductive structure; and
 an encapsulant in the cavity and on the first side of the redistribution structure, the encapsulant contacting a lateral side of the electronic component, a lateral side of the cavity, and a lateral side of the pillar, wherein the encapsulant is a single layer.

2. The semiconductor structure of claim 1, wherein sidewalls of the pillar are tapered.

3. The semiconductor structure of claim 1, wherein a width of the pillar near the redistribution structure is greater than a width of the pillar distal away from the redistribution structure.

4. The semiconductor structure of claim 1, wherein the cavity substrate extends continuously around the electronic component in a plan view.

5. The semiconductor structure of claim 1, wherein the electronic component has a first thickness greater than a second thickness of the first substrate.

6. The semiconductor structure of claim 1, wherein the encapsulant completely separates the electronic component and the cavity substrate.

7. The semiconductor structure of claim 1, further comprising a semiconductor package coupled to the cavity substrate, wherein the cavity substrate is between the semiconductor package and the redistribution structure.

8. A semiconductor structure comprising:
 an interposer, the interposer comprising a cavity; pillars protruding from a first side of the interposer;
 a semiconductor device within the cavity of the interposer, the semiconductor device comprising conductive connectors;
 an encapsulant in the cavity of the interposer, the encapsulant extending between sidewalls of the cavity and sidewalls of the semiconductor device, wherein the encapsulant contacts the first side of the interposer; and
 a redistribution structure on a first surface of the encapsulant, the redistribution structure comprising conductive features electrically coupled to the conductive connectors of the semiconductor device and the pillars protruding from the interposer.

9. The semiconductor structure of claim 8, wherein the pillars protrude a distance in a range between 10 µm and 200 µm from the interposer.

10. The semiconductor structure of claim 9, wherein a thickness of the interposer is in a range between 50 µm and 300 µm.

11. The semiconductor structure of claim 8, wherein the cavity extends completely through the interposer.

12. The semiconductor structure of claim 8, wherein the interposer completely surrounds the semiconductor device in a plan view.

13. The semiconductor structure of claim 8, wherein the encapsulant extends along sidewalls of the pillars.

14. The semiconductor structure of claim 13, wherein the encapsulant extends along sidewalls of the conductive connectors.

15. A method comprising:
 attaching an interposer to a carrier, the interposer comprising a substrate and a conductive pillar protruding from the substrate, the substrate comprising a hole extending through the substrate;
 attaching a semiconductor device to the carrier, wherein, after attaching the interposer and the semiconductor device, the semiconductor device is in the hole of the substrate of the interposer in a plan view;
 encapsulating the semiconductor device in the hole with an encapsulant, the encapsulant extending from a sidewall of the substrate to a sidewall of the semiconductor device;
 planarizing the encapsulant, wherein the planarizing exposes the conductive pillar of the interposer and conductive elements of the semiconductor device; and
 forming a redistribution structure over the encapsulant, the redistribution structure comprising conductive features electrically coupled to the conductive elements of the semiconductor device and the conductive pillar of the interposer.

16. The method of claim 15, wherein the encapsulant extends along sidewalls of the conductive pillar.

17. The method of claim 15, further comprising:
 removing the carrier from the interposer and the semiconductor device; and
 attaching an integrated circuit package to the interposer, the semiconductor device being between the integrated circuit package and the redistribution structure.

18. The method of claim 17, wherein attaching the integrated circuit package to the interposer is performed using solder joints, wherein the solder joints extend into the interposer.

19. The method of claim 15, wherein the encapsulant extends along an entirety of a first sidewall of the semiconductor device in a cross-sectional view.

20. The method of claim 19, wherein the encapsulant extends along an entirety of a second sidewall of the interposer in the cross-sectional view.

* * * * *